United States Patent [19]

Wu

[11] Patent Number: 6,008,087
[45] Date of Patent: Dec. 28, 1999

[54] METHOD TO FORM HIGH DENSITY NAND STRUCTURE NONVOLATILE MEMORIES

[75] Inventor: Shye-Lin Wu, Hsinchu, Taiwan

[73] Assignee: Texas Instruments - Acer Incorporated, Hsinchu, Taiwan

[21] Appl. No.: 09/002,607

[22] Filed: Jan. 5, 1998

[51] Int. Cl.[6] .............................................. H01L 21/8247
[52] U.S. Cl. ......................................... 438/257; 438/264
[58] Field of Search ..................................... 438/257–267

[56] References Cited

U.S. PATENT DOCUMENTS

| | | |
|---|---|---|
| 5,073,513 | 12/1991 | Lee . |
| 5,143,860 | 9/1992 | Mitchell et al. . |
| 5,330,924 | 7/1994 | Huang et al. . |
| 5,397,726 | 3/1995 | Bergemont . |
| 5,427,968 | 6/1995 | Hong . |
| 5,635,415 | 6/1997 | Hong ....................................... 438/261 |
| 5,770,501 | 6/1998 | Hong ....................................... 438/264 |
| 5,856,224 | 1/1999 | Sheu ......................................... 438/266 |

*Primary Examiner*—Richard Booth
*Attorney, Agent, or Firm*—Harness, Dickey & Pierce, P.L.C.

[57] ABSTRACT

The present invention includes forming a pad oxide layer on a substrate. A silicon nitride layer is deposited on the pad oxide. Then, an etching process is used to etch the silicon nitride layer, pad oxide. Subsequently, a silicon oxynitride layer is formed on the substrate. An undoped polysilicon layer is deposited on the silicon nitride layer and silicon oxynitride layer. Subsequently, polysilicon side wall spacers are formed. Then, the silicon nitride layer is removed to expose the pad oxide. Then, a blanket ion implantation is carried out to implant dopant into the side wall spacers, and through the pad oxide or the silicon oxynitride layer into the substrate. An oxide layer is deposited on the polysilicon side wall spacers. Then, a chemical mechanical polishing (CMP) is performed for planarization. A further silicon oxynitride layer is grown at the top of the polysilicon side wall spacers. Next, a doped polysilicon layer is formed on the oxide, polysilicon side wall spacers as word line.

25 Claims, 5 Drawing Sheets

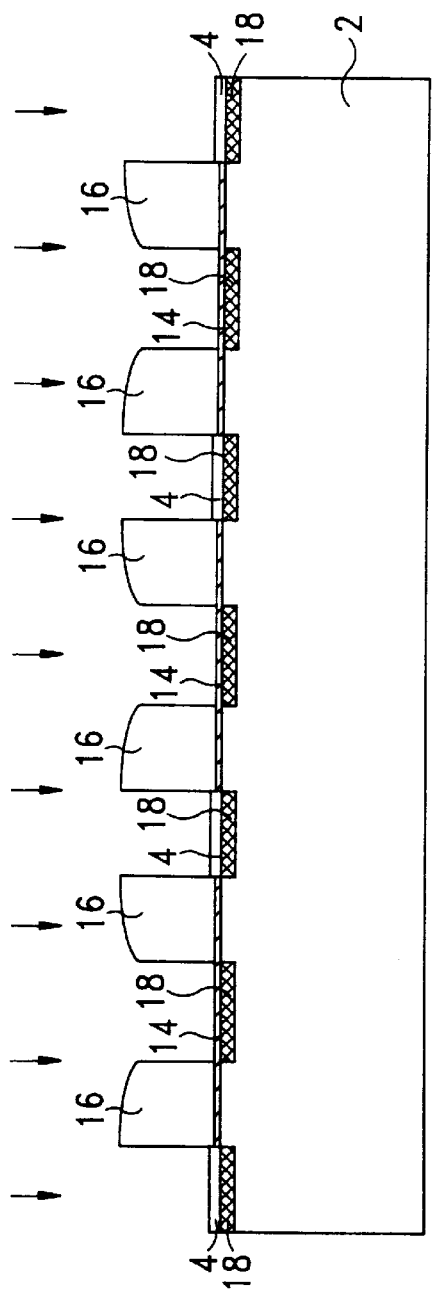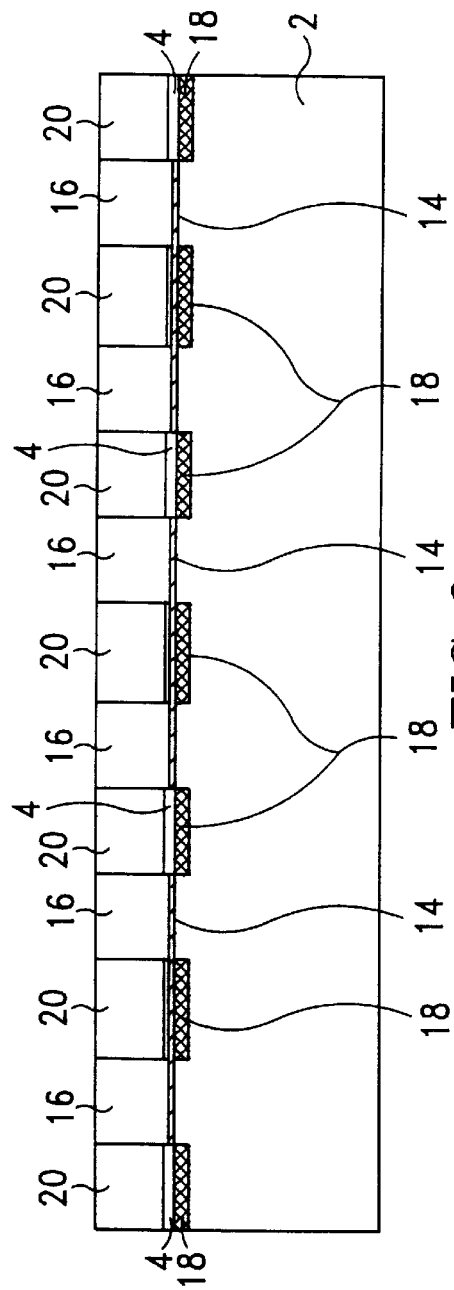

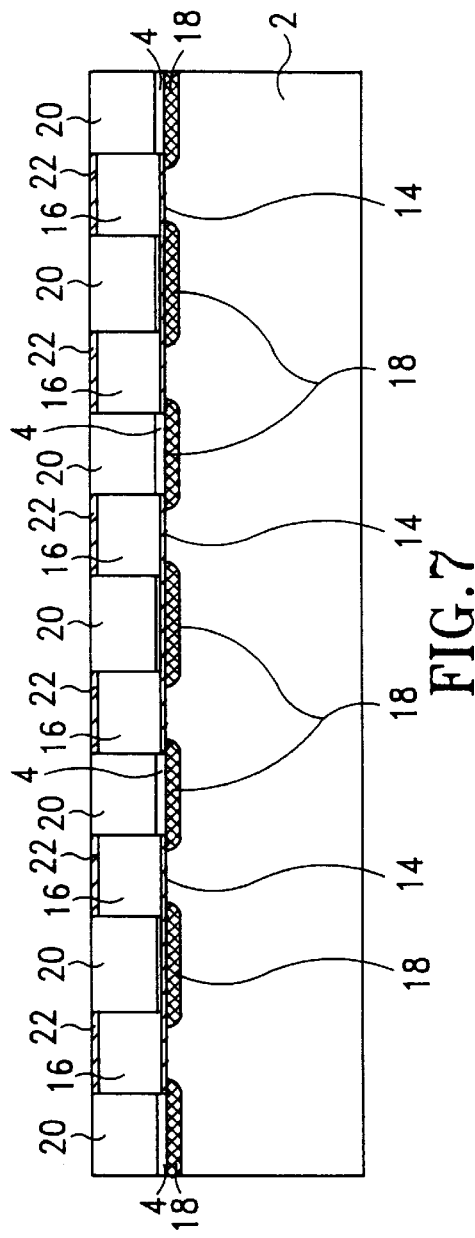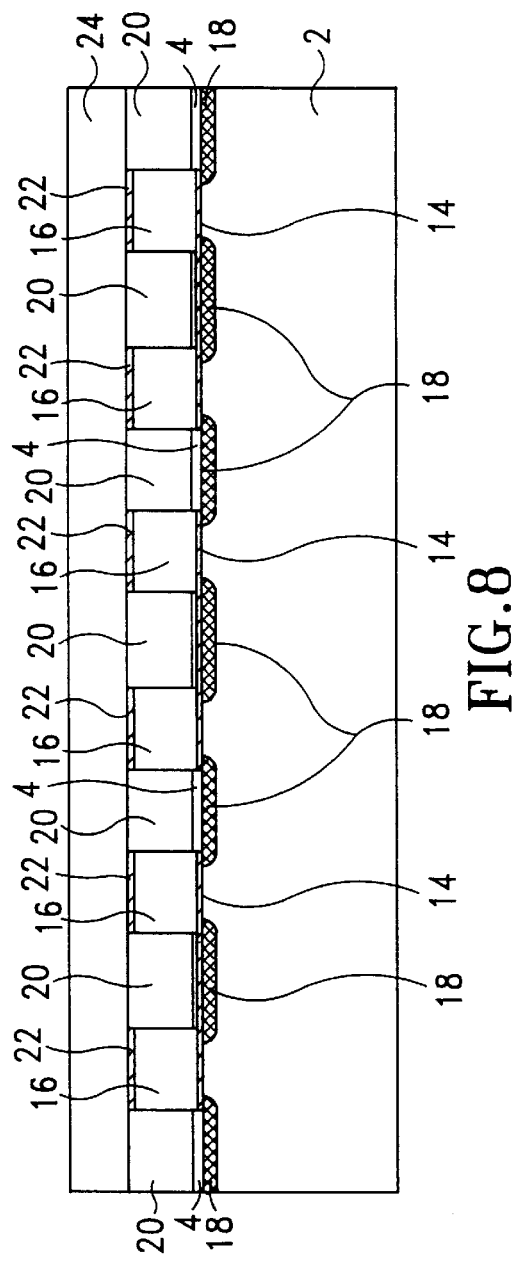

METHOD TO FORM HIGH DENSITY NAND STRUCTURE NONVOLATILE MEMORIES

The present invention relates to a semiconductor device, and more specifically, to a method of fabricating nonvolatile memories.

BACKGROUND OF THE INVENTION

The semiconductor industry has been advanced to the field of Ultra Large Scale Integrated (ULSI) technologies. The fabrication of the nonvolatile memories also follows the trend of the reduction of the size of a device. The nonvolatile memories include various types of devices, such as EAROM (electrically alterable read only memory), EEPROM (electrically erasable programmable read only memory), EEPROM-EAROMs and non-volatile SRAMs. Different types of devices have been developed for specific applications requirements in each of these segments. These parts have been developed with a focus on the high endurance and high speed requirements.

The basic technologies used to manufacture electrically programmable ROMs all utilize to some extent Fowler-Nordheim tunneling which is cold electron tunneling through the energy barrier at a silicon-silicon dioxide interface and into the oxide conduction band. The thin silicon dioxide layer allows charges to tunnel through when a voltage is applied to the gate. These charges are trapped in the silicon dioxide to silicon nitride interface and remain trapped there since the materials are high quality insulators.

Take the EEPROM as an example, in programming mode, a negative voltage is applied to the source and drain while the substrate and gate are grounded. The potential at the central portion of the channel became almost the same as that of the drain and source so that tunneling electrons move from the silicon to the nitride through the thin oxide layer and the electrons are trapped in the nitride. In the mode of erasing, electrons are emitted from the traps in the nitride by applying a negative voltage to the gate electrode while the source and the drain are grounded.

Various nonvolatile memories have been disclosed in the prior art. For example, Mitchellx has proposed EPROMs with self-aligned planar array cell. In this technique, buried diffusion self-aligned to the floating gate avalanche injection MOS transistor are used for the bit lines. Cross point array technology has been disclosed. The self-aligned source and drain will allow this device to be optimized even further for programming speed. See "A New Self-Aligned Planar Cell for Ultra High Density EPROMs, A. T. Mitchellx, IEDM, Tech. pp. 548–553, 1987". Bergemont proposed another cell array for high density flash EEPROM, which can be seen in "NOR Virtual Ground (NVG)- A New Scaling Concept for Very High Density FLASH EEPROM and its Implemntation in a 0.5 $\mu$m Process, A Bergemont, IEEE, pp. 15–18, 1993". This cell structure is introduced for scaling down the size of the devices to fabricate high density EEPROMs. In the flash array schematic, one metal bit line is shared between two columns of cells. The NVG array uses select devices at the top and bottom of each array block. The metal bit lines are connected through contacts to every other diffusion bit line. Another prior art that relates to the field is the article "A 0.67 um2 Self-Aligned Shallow Trench Isolation Cell (SA-STI CELL) for 3V-only 256 Mbit EEPROMs, S. Aritome, IEEE, pp. 61–64, 1994". Aritome proposed a NAND structure EEPROM that reduces the cell size without scaling of the device dimension.

Typically, the high density nonvolatile memories can be applied as the mass storage of portable handy terminals, solid state camera and PC cards. That is because that the nonvolatile memories exhibit many advantages, such as a fast access time, low power dissipation, and robustness. Further, it can be used to replace magnetic disk memory. However, it is difficult to make the sub-0.1 $\mu$m nonvolatile memory by using the current lithography technology.

SUMMARY OF THE INVENTION

The method of the present invention includes forming a pad oxide layer on a substrate. Then, a silicon nitride layer is deposited on the pad oxide. A photoresist is patterned on the silicon nitride layer. Then, an etching process is used to etch the silicon nitride layer, pad oxide by using the photoresist as an etching mask for defining the silicon nitride pattern. After the silicon nitride pattern is defined, the photoresist is removed away. Subsequently, a silicon oxynitride layer is formed on the substrate. The silicon oxynitride layer is formed by thermal oxidation in $N_2O$ or NO environment. The temperature for forming the silicon oxynitride layer ranges from 700 to 1150 degrees centigrade.

An undoped polysilicon layer is deposited on the silicon nitride pattern and silicon oxynitride layer. Subsequently, an anisotropical etching is performed to etch the polysilicon layer for forming side wall spacers. The silicon nitride pattern is removed. Thus, the pad oxide is exposed by the step. Then, a blanket ion implantation is carried out to implant dopant into the side wall spacers, and through the pad oxide or the silicon oxynitride layer into the substrate. An oxide layer is deposited on the gates by using chemical vapor deposition. Then, a chemical mechanical polishing (CMP) is performed to remove a portion of the oxide layer, and the floating gates for planarization. A silicon oxynitride layer is grown at the top of the polysilicon side wall spacers. Next, a doped polysilicon layer is formed on the oxide, polysilicon side wall spacers as word line.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 is a cross section view of a semiconductor wafer illustrating the steps of removing the silicon nitride layer and performing an ion implantation according to the present invention.

FIG. 6 is a cross section view of a semiconductor wafer illustrating the steps of forming an oxide and performing a planarization according to the present invention.

FIG. 7 is a cross section view of a semiconductor wafer illustrating the step of forming a second silicon oxynitride layer according to the present invention.

FIG. 8 is a cross section view of a semiconductor wafer illustrating the step of forming a word line according to the present invention.

DETAILED DESCRIPTION OF THE PREFERRED EMBODIMENT

The present invention proposes a novel method to fabricate a sub-micron meter NAND cell structure nonvolatile memory. In the method, polysilicon spacers will be used as an ion implantation mask. The array density of the devices can be significantly increased by using the current lithography technology. Further, the proposed recipe is more simple than the prior art. The detail description will be seen as follows.

Figure 1:
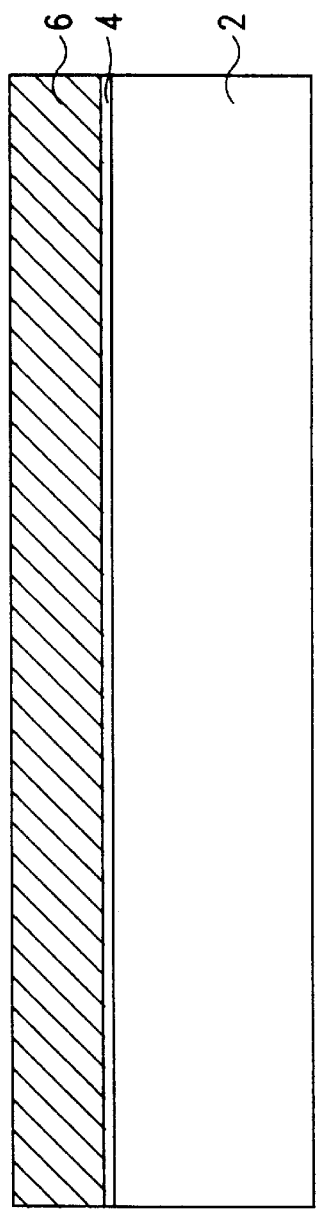
FIG. 1 is a cross section view of a semiconductor wafer illustrating the steps of forming a pad oxide and silicon nitride layer on a semiconductor substrate according to the present invention.

In a preferred embodiment, as shown in the FIG. 1, a single crystal silicon substrate 2 with a <100> crystallographic orientation is provided. A pad oxide layer 4 consisted of silicon oxide is formed on the substrate 2 to act as a cushion between the silicon substrate 2 and subsequent silicon nitride layer 6 for reducing the stress between them. Typically, the pad oxide 4 can be grown in an oxygen ambient in a furnace at a temperature of about 800 to 1100 degrees centigrade. Other method, such as chemical vapor deposition, can be used to form the pad oxide 4. Then, a silicon nitride layer 6 is deposited on the pad oxide 4.

Figure 2:
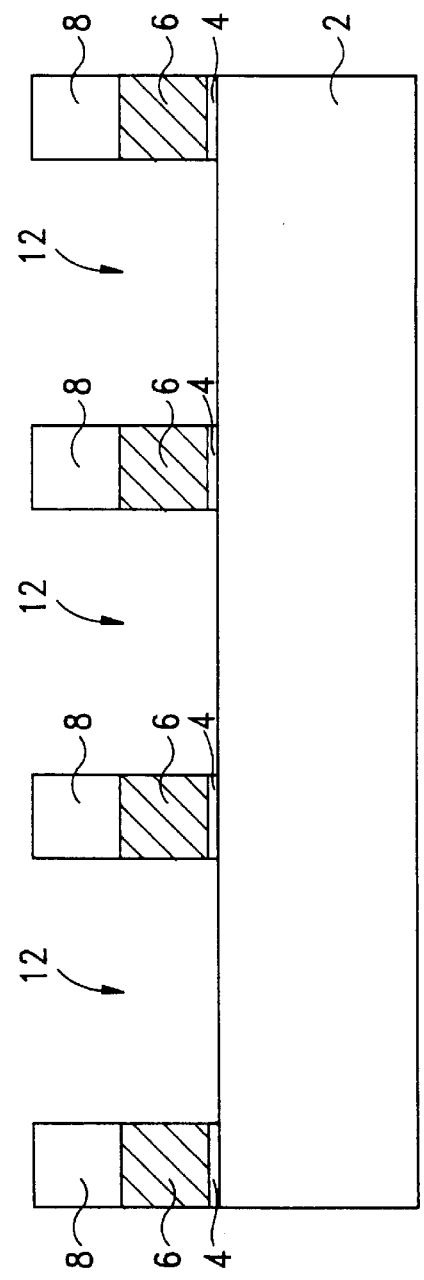
FIG. 2 is a cross section view of a semiconductor wafer illustrating the step of etching the pad oxide and the silicon nitride layer according to the present invention.

Turning to FIG. 2, a photoresist 8 having openings 10 is patterned on the silicon nitride layer 6 using lithography process to expose portions of the silicon nitride layer 6. Then, an etching process is used to etch the silicon nitride layer 6, pad oxide 4 by using the photoresist 8 as an etching mask for defining the silicon nitride pattern 6. Thus, portions of the substrate 2 are exposed by this step. In the preferably embodiment, the photoresist 8 includes a plurality of individual portions separated with each other. The widths of the individual portions are about 300 to 3000 angstroms. The width of the openings 12 can range from 500 to 5000 angstroms. After the silicon nitride pattern is defined, the photoresist 8 is removed away.

Figure 3:
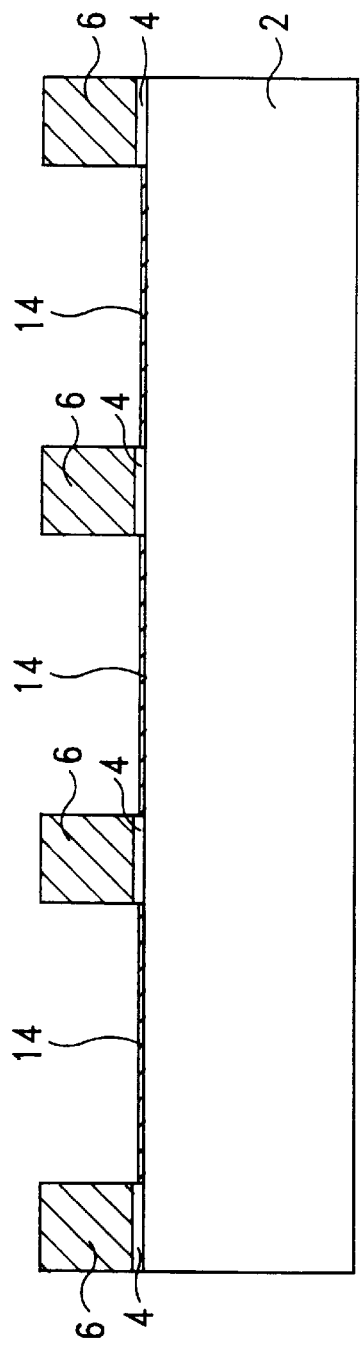
FIG. 3 is a cross section view of a semiconductor wafer illustrating the step of forming silicon oxynitride layer according to the present invention.

Subsequently, an ultra thin dielectric layer, such as silicon oxynitride layer 14, is formed on the substrate 2 where is exposed by the silicon nitride pattern 6, and adjacent to the pad oxide 4, as shown in FIG. 3. In a case, the silicon oxynitride layer 14 is formed by thermal oxidation in $N_2O$ or NO environment. The temperature for forming the silicon oxynitride layer 14 ranges from 700 to 1150 degrees centigrade. The thickness is preferably about 25 to 150 angstroms.

Figure 4:
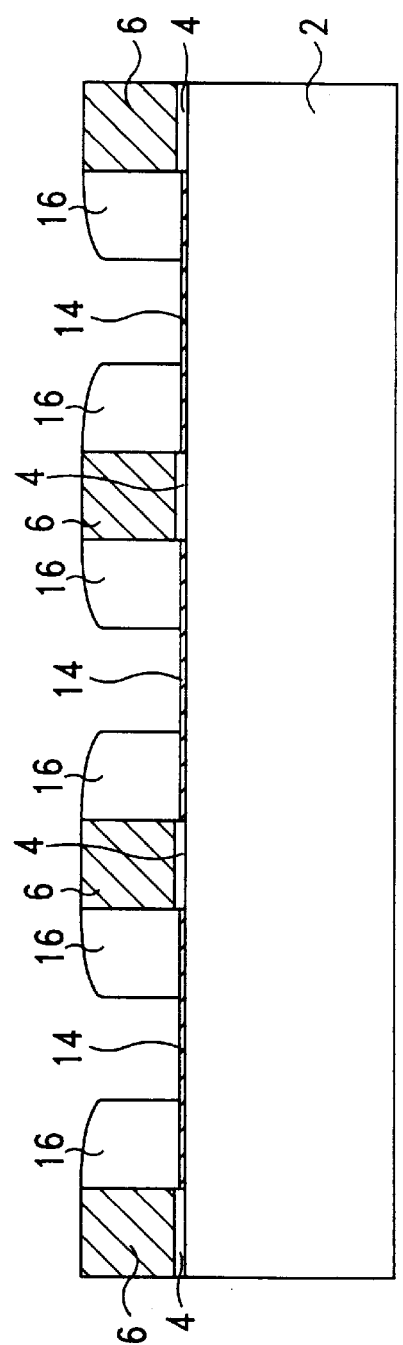
FIG. 4 is a cross section view of a semiconductor wafer illustrating the step of forming polysilicon side wall spacers according to the present invention.

Turning to FIG. 4, polysilicon side wall spacers 16 are formed on the side walls of the silicon nitride pattern 6. In order to achieve this, an undoped polysilicon layer 16 is deposited along the surface of the silicon nitride pattern 6 and on the silicon oxynitride layer 14 to a thickness about 200 to 3000 angstroms. Subsequently, an anisotropical etching is performed to etch the polysilicon layer 16, thereby forming the side wall spacers 16. The width of the side wall spacers 16 is depended on the thickness of the undoped polysilicon layer 16. The polysilicon side wall spacers 16 will used as floating gates later. Thus, the use of the thickness of the polysilicon layer 16 can control the size of the gates. A first portion of the silicon oxynitride layer 14 is exposed by the side wall spacers 16, a second portion of the silicon oxynitride layer 14 is remained under the side wall spacers 16.

Turning to FIG. 5, the following step is to remove the silicon nitride pattern 6 to leave the side wall spacers 16 remaining over the substrate 2. Thus, the pad oxide 4 is exposed by the stripping step. In the embodiment, the silicon nitride can be removed by using hot phosphorus acid solution. Then, a blanket ion implantation is carried out to implant dopant into the side wall spacers 16, and through the pad oxide 4 or the silicon oxynitride layer 14 into the substrate 2. The dosage and the ion implantation energy of the step are respectively about 1E14 to 1E16 atoms/cm$^2$, about 1 to 30 KeV. As can be seen in the FIG. 5, the source and drain 18 are formed under this ion implantation. Further, the polysilicon side wall spacers 16 are used as floating gates of devices.

As shown in FIG. 6, a thick oxide layer 20 is deposited on the gates 16 and filled between the gates 16 by using chemical vapor deposition. Then, a chemical mechanical polishing (CMP) is performed to remove a portion of the oxide layer 20, and the floating gates 16. A planar topography is achieved by using the well known technology. Referring to FIG. 7, a further silicon oxynitride layer 22 is grown at the top of the floating gates 16 for isolation. Similarly, this is achieved by thermal oxidation in $N_2O$ or NO environment at a temperature of about 700 to 1150 degrees centigrade.

Next, as can be seen by reference to FIG. 8, a conductive layer, such as doped polysilicon layer 24, is formed on the oxide 20, floating gates 16 as word line. The doped polysilicon layer 24 can be chosen from doped polysilicon or in-situ doped polysilicon. In a case, the type of the dopant can be n+ conductive type. In addition, the metal or alloy layer can be used as the conductive layer.

Figure 9:
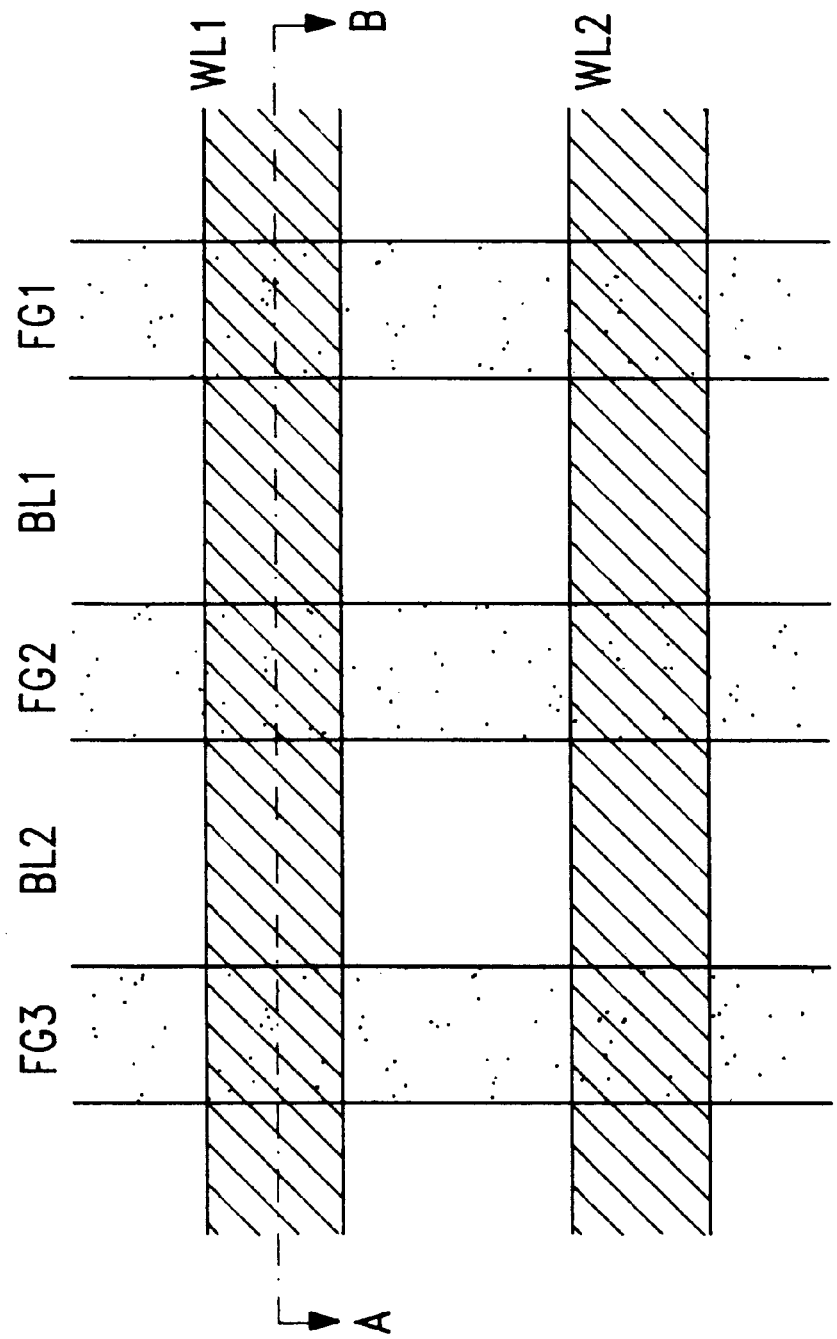
FIG. 9 is a nonvolatile memory array schematic according to the present invention.

FIG. 9 is a nonvolatile memory array schematic according to the present invention. FIG. 8 is a cross section view taken from the A-B line of FIG. 9. In FIG. 9, a plurality of vertical lines used as floating gates (FG1, FG2, FG3, . . . ) are configured over a substrate. The bit lines (BL1, BL2, BL3, . . . ) are arranged between two columns of floating gates. Each bit line is shared between two floating gates. Word lines (WL1, WL2, . . . ) are cross over the floating gates, respectively.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for manufacturing a nonvolatile memory on a semiconductor substrate, said method comprising the steps of:

forming a pad oxide layer on said semiconductor substrate;

forming a silicon nitride layer on said pad oxide layer; patterning said silicon nitride layer, said pad oxide layer to expose portions of said semiconductor substrate;

forming a first dielectric layer on said semiconductor substrate which is exposed by said patterning;

forming a polysilicon layer on said first dielectric layer and said silicon nitride layer;

etching said polysilicon layer to form side wall spacers on side walls of said silicon nitride layer, a first portion of said first dielectric layer being exposed by said side wall spacers, a second portion of said first dielectric layer remaining under said side wall spacers;

removing said silicon nitride layer;

performing an ion implantation to implant dopant into said side wall spacers and through said pad oxide and said first dielectric layer into said semiconductor substrate;

forming a second dielectric layer on said side wall spacers, said pad oxide, and said first dielectric layer;

performing a planarization process to achieve a planar topography, wherein said side wall spacers are used as floating gates of said nonvolatile memory;

forming a third dielectric layer on said floating gates; and forming a conductive layer over said floating gates, on said second dielectric layer, and said third dielectric layer to act as a word line of said nonvolatile memory.

2. The method of claim 1, wherein said first dielectric layer comprises silicon oxynitride.

3. The method of claim 2, wherein said first dielectric layer is formed by oxidation in a $N_2O$ ambient.

4. The method of claim 2, wherein said first dielectric layer is formed by oxidation in a NO ambient.

5. The method of claim 2, wherein said first dielectric layer is formed at a temperature of about 700 to 1150 degrees centigrade.

6. The method of claim 1, wherein said second dielectric layer comprises oxide.

7. The method of claim 1, wherein said first dielectric layer comprises silicon oxynitride.

8. The method of claim 7, wherein said first dielectric layer is formed by oxidation in a $N_2O$ ambient.

9. The method of claim 7, wherein said first dielectric layer is formed by oxidation in a NO ambient.

10. The method of claim 7, wherein said first dielectric layer is formed at a temperature of about 700 to 1150 degrees centigrade.

11. The method of claim 1, wherein said polysilicon layer comprises an undoped polysilicon layer.

12. The method of claim 1, wherein the dopant for said ion implantation is n conductive type dopant.

13. The method of claim 1, wherein the dosage of said ion implantation is about 1E14 to 1E16 atoms/cm$^2$.

14. The method of claim 1, wherein the energy of said ion implantation is about 1 to 30 KeV.

15. A method for manufacturing a nonvolatile memory on a semiconductor substrate, said method comprising the steps of:

forming a pad oxide layer on said semiconductor substrate;

forming a silicon nitride layer on said pad oxide layer;

patterning said silicon nitride layer and said pad oxide layer to expose portions of said semiconductor substrate;

forming a first silicon oxynitride layer on said semiconductor substrate which is exposed by said patterning;

forming a polysilicon layer on said first silicon oxynitride layer and said silicon nitride layer;

etching said polysilicon layer to form side wall spacers on side walls of said silicon nitride layer, a first portion of said first silicon oxynitride layer being exposed by said side wall spacers, a second portion of said first silicon oxynitride layer remaining under said side wall spacers;

removing said silicon nitride layer;

performing an ion implantation to implant dopant into said side wall spacers and through said pad oxide and said first silicon oxynitride layer into said semiconductor substrate;

forming an oxide layer on said side wall spacers, said pad oxide, said first silicon oxynitride layer;

performing a planarization process to achieve a planar topography, wherein said side wall spacers are used as floating gates of said nonvolatile memory;

forming a second silicon oxynitride layer on said floating gates; and forming a conductive layer over said floating gates, on said oxide layer, said second silicon oxynitride layer to act as a word line of said nonvolatile memory.

16. The method of claim 15, wherein said first silicon oxynitride layer is formed by oxidation in a $N_2O$ ambient.

17. The method of claim 15, wherein said first silicon oxynitride layer is formed by oxidation in a NO ambient.

18. The method of claim 15, wherein said first silicon oxynitride layer is formed at a temperature of about 700 to 1150 degrees centigrade.

19. The method of claim 15, wherein said second silicon oxynitride layer is formed by oxidation in a $N_2O$ ambient.

20. The method of claim 15, wherein said second silicon oxynitride layer is formed by oxidation in a NO ambient.

21. The method of claim 15, wherein said second silicon oxynitride layer is formed at a temperature of about 700 to 1150 degrees centigrade.

22. The method of claim 15, wherein said polysilicon layer comprises an undoped polysilicon layer.

23. The method of claim 15, wherein the dopant for said ion implantation is n conductive type dopant.

24. The method of claim 15, wherein the dosage of said ion implantation is about 1E14 to 1E16 atoms/cm$^2$.

25. The method of claim 15, wherein the energy of said ion implantation is about 1 to 30 KeV.

* * * * *